(12) United States Patent
Huff

(10) Patent No.: US 12,194,464 B1
(45) Date of Patent: Jan. 14, 2025

(54) INTEGRATED MICROFLUIDIC SYSTEM AND METHOD OF FABRICATION

(71) Applicant: CORPORATION FOR NATIONAL RESEARCH INITIATIVES, Reston, VA (US)

(72) Inventor: Michael A. Huff, Oakton, VA (US)

(73) Assignee: Corporation for National Research Initiatives, Reston, VA (US)

( * ) Notice: Subject to any disclaimer, the term of this patent is extended or adjusted under 35 U.S.C. 154(b) by 0 days.

(21) Appl. No.: 17/712,735

(22) Filed: Apr. 4, 2022

(51) Int. Cl.
| | | |
|---|---|---|
| *B01L 3/00* | (2006.01) | |
| *B01F 23/00* | (2022.01) | |
| *B01F 23/41* | (2022.01) | |
| *B01F 101/23* | (2022.01) | |
| *B23Q 17/24* | (2006.01) | |
| *B81B 7/02* | (2006.01) | |
| *B81C 1/00* | (2006.01) | |
| *B81C 3/00* | (2006.01) | |
| *C07K 14/705* | (2006.01) | |
| *C12M 1/34* | (2006.01) | |
| *C12Q 1/04* | (2006.01) | |
| *C12Q 1/18* | (2006.01) | |
| *C12Q 1/686* | (2018.01) | |
| *G01N 21/3577* | (2014.01) | |
| *G01N 21/359* | (2014.01) | |

(Continued)

(52) U.S. Cl.
CPC ... *B01L 3/502715* (2013.01); *B01L 3/502738* (2013.01); *B81B 7/02* (2013.01); *B81C 1/00849* (2013.01); *B81C 3/001* (2013.01); *G02F 1/133516* (2013.01); *B01L 2300/0663* (2013.01); *B01L 2400/0439* (2013.01); *B01L 2400/0622* (2013.01); *B81B 2201/0264* (2013.01); *B81B 2201/05* (2013.01); *B81B 2201/054* (2013.01)

(58) Field of Classification Search
CPC ........ B01L 3/502715; B01L 3/502738; B01L 2300/0663; B01L 2400/0439; B01L 2400/0622; B81B 7/02; B81B 2201/0264; B81B 2201/054; B81C 1/00849; B81C 3/001
See application file for complete search history.

(56) References Cited

U.S. PATENT DOCUMENTS

| | | | | |
|---|---|---|---|---|
| 5,238,223 A | * | 8/1993 | Mettner | .... F15C 5/00 251/367 |
| 2004/0245102 A1 | * | 12/2004 | Gilbert | ..... B01L 3/502715 156/60 |

(Continued)

*Primary Examiner* — Jennifer Wecker
*Assistant Examiner* — Oyeleye Alexander Alabi
(74) *Attorney, Agent, or Firm* — Nixon & Vanderhye, P.C.

(57) ABSTRACT

An integrated microfluidic systems and the method of fabrication is disclosed wherein various microfluidic devices fabricated onto substrates are bonded together either using an intermediary layer or not to facilitate the bonding process. The microfluidic ports on the microfluidic devices are aligned prior to bonding and the bonding results in leak-proof seals between the devices. Moreover, the fluidic capacitance using the present invention is eliminated thereby enabling microfluidic systems with far faster time responses. The example embodiments have a wide range of applications including medical, industrial control, aerospace, automotive, consumer electronics and products, as well as any application(s) requiring the use of multiple microfluidic devices.

7 Claims, 11 Drawing Sheets

(51) Int. Cl.
  *G01N 21/39* (2006.01)
  *G01N 21/45* (2006.01)
  *G01N 21/64* (2006.01)
  *G01N 27/414* (2006.01)
  *G01N 30/12* (2006.01)
  *G01N 30/68* (2006.01)
  *G01N 30/70* (2006.01)
  *G01N 30/72* (2006.01)
  *G01N 30/88* (2006.01)
  *G01N 33/00* (2006.01)
  *G01N 33/18* (2006.01)
  *G01N 33/50* (2006.01)
  *G01N 33/53* (2006.01)
  *G01N 33/543* (2006.01)
  *G01N 33/68* (2006.01)
  *G01N 33/74* (2006.01)
  *G02F 1/1335* (2006.01)
  *H10K 10/46* (2023.01)
  *H10K 85/00* (2023.01)
  *H10K 85/20* (2023.01)

(56) References Cited

U.S. PATENT DOCUMENTS

| | | | |
|---|---|---|---|
| 2005/0092662 A1* | 5/2005 | Gilbert | B01L 3/50273 210/97 |
| 2014/0322489 A1* | 10/2014 | Unger | F16K 13/00 428/156 |
| 2015/0247580 A1* | 9/2015 | Au | F16K 99/0015 137/613 |
| 2017/0097108 A1* | 4/2017 | Huff | F16K 99/0038 |
| 2020/0181566 A1* | 6/2020 | Aw Yong | C12M 29/18 |

* cited by examiner

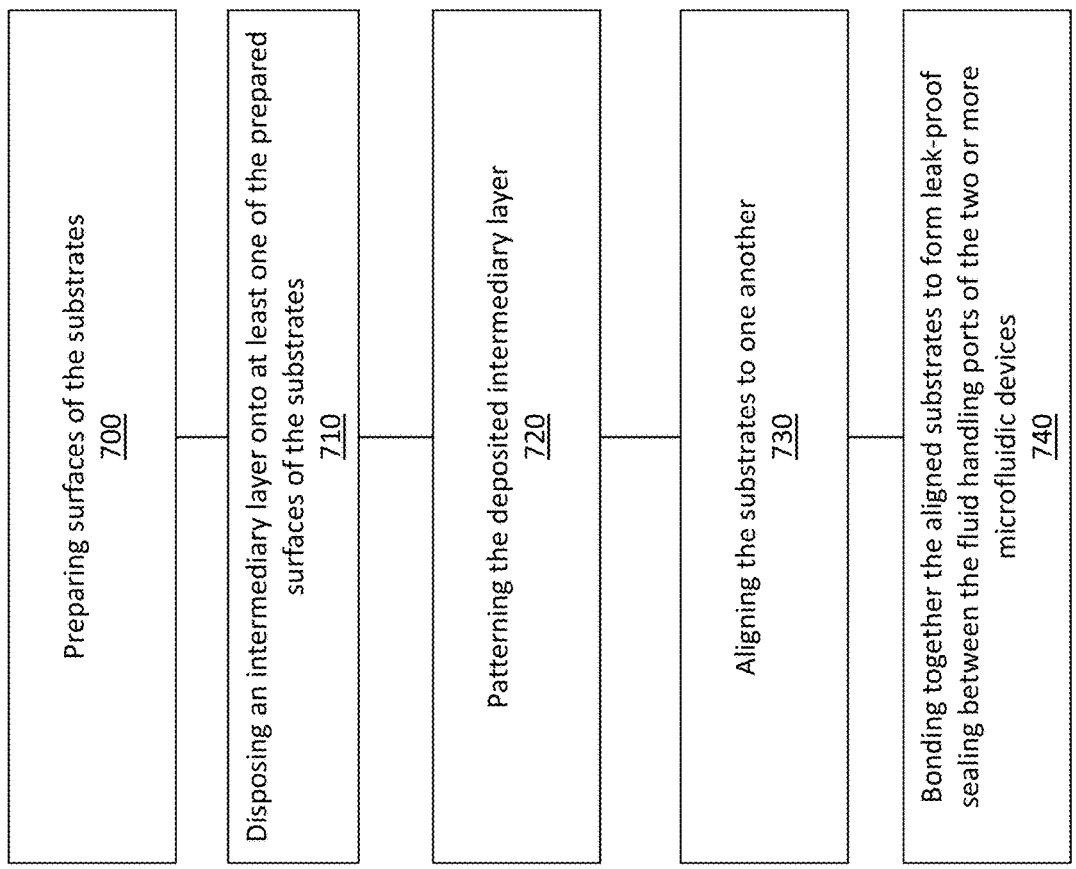

INTEGRATED MICROFLUIDIC SYSTEM AND METHOD OF FABRICATION

This invention was made with government support under FA8651-16-C-0258 awarded by the Air Force. The government has certain rights in the invention.

FIELD OF INVENTION

The present invention is directed to micro-scale microfluidic elements and sensors that are integrated together to form a system. Specifically, a system composed of a micromachined, micro-scale 3-way microvalve that is integrated to a micro-scale pressure sensor is disclosed. The integrated microvalve and pressure sensor has the distinct advantage of a faster pneumatic response due to the integration of the components that enables significant reduction in the pneumatic capacitance of the device. This present invention has a wide range of applications including medical, industrial control, aerospace, automotive, consumer electronics and products, as well as any application(s) requiring the use of valves and sensors for the control, measurement and monitoring of pressurized fluids.

BACKGROUND

Fluidic systems are often composed of a variety of fluidic components, including valves, pumps, flow resistors, pressure sensors, mixers, etc. Fluidic systems can be implemented at the macroscale and the microscale. Fluidic systems implemented at the microscale are often called "microfluidic systems." Most often, microfluidic components are implemented using semiconductor manufacturing methods that are composed of a sequentially performed set of processing steps on substrates. The substrates are usually made of single-crystal silicon, but can be made from other semiconductors as well as glass, ceramic, plastic, or metal. In general, the fabrication process sequences for implementing microfluidic systems are often highly customized for each component. For example, the fabrication process for a microvalve is likely to be vastly different from the fabrication process for a micro-pressure sensor. The design details will be different, the functionality is different and the process steps used in the fabrication process sequence will be very different. Therefore, while a number of different microfluidic components have been developed and reported in the literature, it has been very difficult to integrate different microfluidic components together to form a microfluidic system, particularly when the process sequences to fabricate the different components are vastly different.

The above information is presented as background information only to assist with an understanding of the present disclosure. No determination has been made, and no assertion is made, as to whether any of the above might be applicable as prior art with regard to the present disclosure.

SUMMARY OF INVENTION

The present invention is directed to micro-scale microfluidic elements and sensors that are integrated together to form a system. Specifically, a system composed of a micromachined, micro-scale 3-way microvalve that is integrated to a micro-scale pressure sensor is disclosed. The integrated microvalve and pressure sensor has the distinct advantage of a faster pneumatic response due to the integration of the components that enables significant reduction in the pneumatic capacitance of the device. This present invention has a wide range of applications including medical, industrial control, aerospace, automotive, consumer electronics and products, as well as any application(s) requiring the use of valves and sensors for the control, measurement and monitoring of pressurized fluids.

BRIEF DESCRIPTION OF THE DRAWINGS

FIG. 7 illustrates steps of a method for fabrication an integrated microfluidic system, according to another example embodiment.

DETAILED DESCRIPTION OF THE INVENTION

Figure 1A:
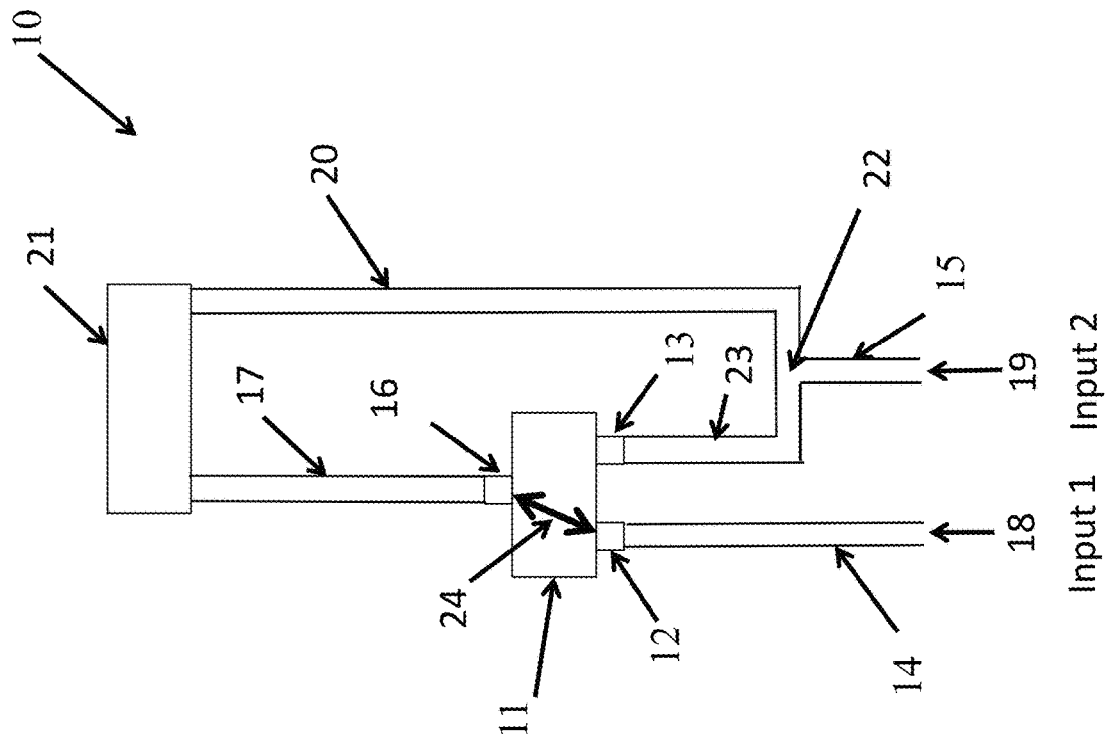
FIGS. 1A and 1B provide an illustration of the issues involved using current technologies to implement microfluidic systems using discrete microfluidic devices.
Figure 1B:
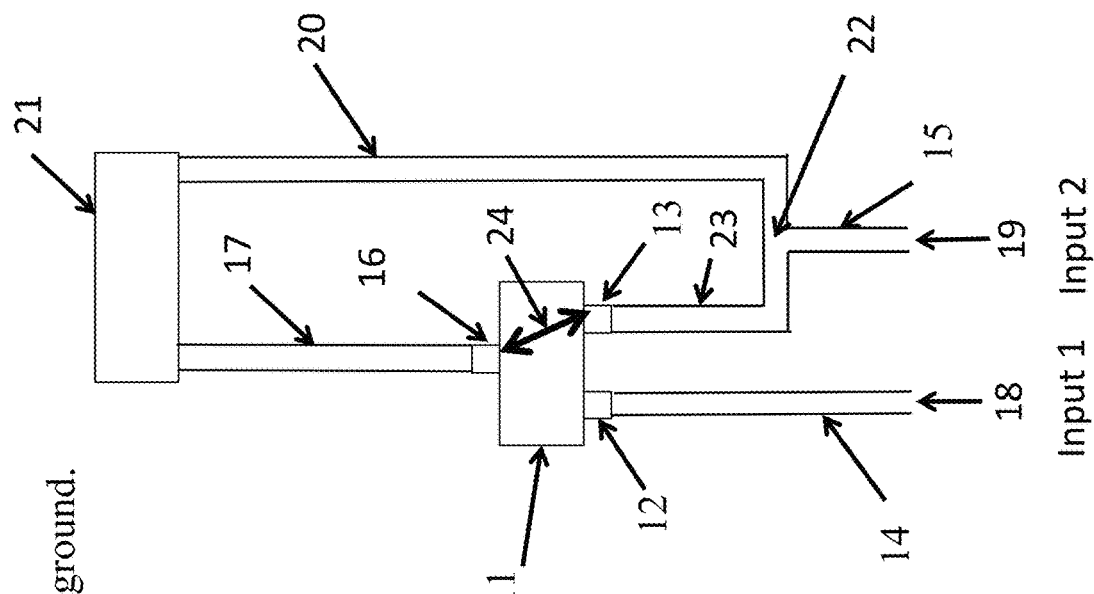

An example of a fluidic system 10 involving multiple components is shown in FIGS. 1A and 1B as "Background." It is seen that there are two active components in this fluidic system 10; a 3-way valve 11 and a pressure sensor 21 that are connected into a fluidic system 10 using fluid conduits, composed of tubing or piping.

The 3-way valve 11 has two inlet ports, a first inlet port 12 and a second inlet port 13, and has a one outlet port 16. The 3-way valve 11 can either connect the first inlet port 12 to the outlet port 16 in one state condition of the fluidic system 10 shown in FIG. 1B or connect the second inlet port 13 to the outlet port 16 in a second state condition of the fluidic system shown in FIG. 1A. The valve 11 switching mechanism 24 to connect the outlet port 16 to either the first inlet port 12 or the second inlet port 13 can be manual or electromechanical with electromechanical functionality being preferable since the valve 11 can be controlled using an electrical signal or control system and electrically coupled to the pressure sensor 21.

There are two inputs to this fluidic system 10, a first input 18, and a second input 19. The first input 18 connects to 3-way valve 11 first inlet port 12 by a fluid conduit 14. The second input 19 enters a conduit 15 that is connected to a "T" conduit 22 that branches into two fluid paths via conduits 20 and 23, wherein one of those fluid conduits 23 connects to the second inlet port 13 of the 3-way valve 11 and the other conduit branch 20 connects to one-side of a differential pressure sensor 21. The foutlet port 16 of the 3-way valve is connected to the other side of the differential pressure sensor 21 by a fluid conduit 17. Therefore, the differential pressure sensor 21 is configured to measure or detect the difference in fluidic pressures between conduits 17 and 20.

A first fluidic system 10 state condition is shown in FIG. 1A, the 3-way valve 11 has the switching mechanism 24 set so that 3-way valve 11 second inlet port 13 is connected to the 3-way valve 11 outlet port 16 and the 3-way valve first inlet port 12 is not connected to the 3-way valve outlet port 16. In this state, the fluidic system 10 second input 19, is connected through conduit 15, to the T conduit 22, that branches into conduit 23 that is connect to the 3-way valve 11 second inlet port 13, and because of the 3-way valve 11 switching mechanism 24 is set to connect 3-way valve 11 second inlet port 13 to the 3-way valve 11 outlet port 16, the second fluidic input 19 is thereby connected to one-side of the pressure sensor 21 through conduit 17. Since there is a T branching conduit 22 that divides conduit 15 into two separate conduits, 20 and 23, and conduit 20 is connected to the other side of the pressure sensor 21, the pressure sensor 21 has equal fluid pressures on both sides of the differential pressure sensor 21 and thereby measures a zero pressure differential.

In the other fluidic system 10 state condition shown in FIG. 1B, the 3-way valve 11 has the switching mechanism 24 set so that 3-way valve 11 first inlet port 12 is connected to 3-way valve 11 outlet port 16 and the 3-way valve 11 second inlet port 13 is not connected to 3-way valve 11 outlet port 16. In this state, the first input 18 to the fluidic system 10 is connected through conduit 14 to 3-way valve 11 first inlet port 12, and because of the 3-way valve 11 switching mechanism 24 is configured to the connect 3-way valve 11 first inlet port 12 to the 3-way valve 11 outlet port 16, fluidic system 10 first input 18 is thereby connected to one-side of the pressure sensor 21 through conduit 17, and fluidic system 10 second input 19 is connected to conduit 15 and then to the T branching conduit 22, that then connects on one side to conduit 23 that is connected to the second inlet port 13 of the 3-way valve 11 that is blocked since switching mechanism 24 is closed from valve 11 second inlet port 13 to valve 11 outlet port 16, but the other conduit 20 connected to the other side of the T conduit 22 is connected to the other side of the pressure sensor 21. Therefore, in this second state as shown in FIG. 1(B), the differential pressure can be read if the fluids into inputs 18 and 19 have different pressures.

In fluidic systems 10 such as shown in FIG. 1, there are often time response requirements of the combined valve 11, pressure sensor 21, and interconnection conduit system 17 such that when the valve 11 switching mechanism 24 changes from the state in FIG. 1(A) to state shown in FIG. 1(B) the fluid pressure sufficiently charges the conduit 17 between the valve 11 outlet 16 and the pressure sensor 21 within a required time period. This will ensure that the pressure sensor 21 can quickly and accurately read the pressure of the first fluid inlet 18 (see FIG. 1) in the required period of time after the valve switching mechanism 24 connects fluidic system first input 18 to the one side of the pressure sensor 21.

The time constant of such a fluidic system 10 is determined by the product of the appropriate fluidic resistance, $R_f$, and the fluidic capacitance, $C_f$, or $\tau = R_f C_f$. Specifically, the fluidic resistance $R_f$ is the pathway leading to the measurement device and the fluidic capacitance is the composed of the conduit leading to the measurement device, wherein the measurement device is the pressure sensor in the present example.

Typically, the time constant would be of importance when the fluidic system 10 changes from one state to another, such as when the fluidic system 10 changes from the state in FIG. 1(A) to that of the state in FIG. 1(B). In such a case, the fluidic resistance of importance is the flow resistance of the conduits from the first fluidic input 18, the conduit 14, the first inlet port 12 to the valve 11, the valve 11, the outlet port 16, and the conduit 17. These are the flow paths of the fluid that must be traveled when the fluidic system changes state. The fluidic capacitance would be the amount of volume that must be charged with fluid so that it reaches the fluid pressure to be measured and would involve the fluid conduit from the first inlet port 12 of the valve, the valve 11 device, and the conduit from the outlet port 16 of the valve 11 to one side of the pressure sensor 21.

In most fluidic systems designs, the conduits and valve are selected or made such that they have little to no flow resistance. This would be the case when using macroscale elements.

However, in microfluidic systems the situation is often different. First, the flow resistances of microvalves tend to be significantly larger than their macroscale counterparts. One reason is that the strokes or displacements, that is the separation created between the sealing surfaces when in an open state, is usually much smaller in microvalves than for macroscale valves. Typically, the stokes of microvalves is a few microns and perimeter of the sealing surface will be a few millimeters or less. Consequently, the area of the microvalve flow path when the device is open is comparatively small thereby resulting in a large flow resistance. Additionally, if the flow conduits are also microscale, then they may also contribute to the flow resistance. However, in most cases the designer would intentionally ensure that the flow resistance of the microvalve far exceeded the flow resistance of the conduit flow pathways.

In any case, the flow resistance of the microvalve in a fluidic system 10 such as in FIG. 1 is significant and thereby contributes to a proportional increase in the time constant of the fluidic system 10.

The flow capacitance is largely determined by the volume of the space that needs to be charged by the mass of fluid. In general, the fluidic capacitance is given by: $C_f = V_f / \rho c^2$, where $\rho$ is the density of the fluid, equal to about 1.21 kg/m³ for air and c is the velocity of sound in the fluid, equal to about 344 m/s for air, and $V_{max}$ is the total volume of space that is to be charged with fluid to get to the pressure of between the microvalve and the pressure sensor, essentially the volume from outlet port 16 of the microvalve, and the conduit 17 connecting to the pressure sensor 21.

Therefore, it is desirable to reduce the volume of space from the microvalve to the pressure sensor and thereby reduce the fluidic capacitance. The use of tubing or conduit having appreciable volume results in a large volume to be fluidically charged and therefore a large fluidic capacitance. This would particularly be the case if microscale components, such as a microvalve and pressure sensor were used as components in the fluidic system that they were connected together using macroscale tubing or conduits. However, using microscale conduits would further increase the flow resistance and therefore does not help in lower the fluidic time constant. An improved solution is therefore needed and is the object of the present invention.

Examples of the present disclosure are directed to microscale microfluidic elements and sensors that are integrated together to form a system. For example, a system composed of a micromachined, micro-scale 3-way microvalve that is integrated to a micro-scale pressure sensor is disclosed. It is noteworthy that example embodiments are applicable to any microfluidic system that can be integrated. The integrated microvalve and pressure sensor has the distinct advantage of a faster pneumatic response due to the integration of the components that enables significant reduction in the pneumatic capacitance of the device. It also reduce the size and cost of the system and improves its reliability. Example embodiments have a wide range of applications including medical, industrial control, aerospace, automotive, consumer electronics and products, as well as any application(s) requiring the use of valves and sensors for the control, measurement and monitoring of pressurized fluids.

Figure 2A:
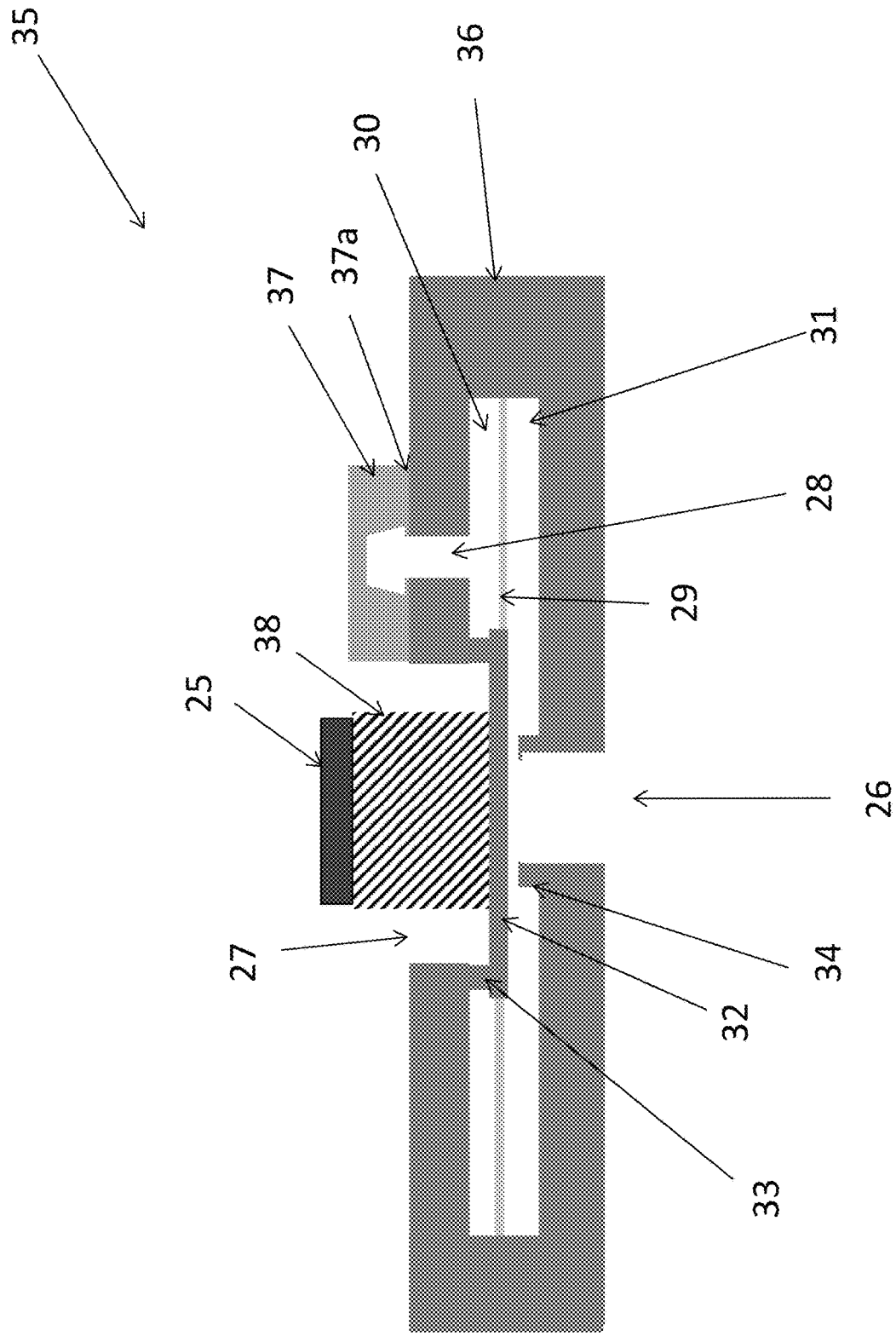
FIGS. 2A and 2B are cross sectional illustrations of an integrated microfluidic system of the present invention.

An example embodiment 35 of the present disclosure is shown in FIG. 2A. FIG. 2A illustrates a cross-sectional view of an example embodiment and is not to dimensional scale. A 3-way microvalve 36 that uses a stacked piezoelectric actuator 38 is shown with a first inlet port 27 on the top of the microvalve 36 and a second inlet port 26 at the bottom of the microvalve 36. The microvalve 36 has one outlet port 28. As shown in FIG. 2A, the microvalve 36 is closed to fluid flowing from the first inlet port 27 to the outlet port 28. This is due to the plunger membrane (e.g., plunger plate 32) of the microvalve 36 being in physical contract with the sealing rings or surfaces 33. In the microvalve 36 state shown in FIG. 2A, the fluid flowing from the second inlet port 26 can pass through the gap between the sealing surfaces 34 and the plunger plate 32, travel through the lower valve chamber 31, then through openings in the valve membrane 29, then through the upper valve chamber 30 and out the microvalve 36 outlet port 28. In the state shown in FIG. 2A, the stacked piezoelectric actuator 38 is not actuated.

Figure 2B:
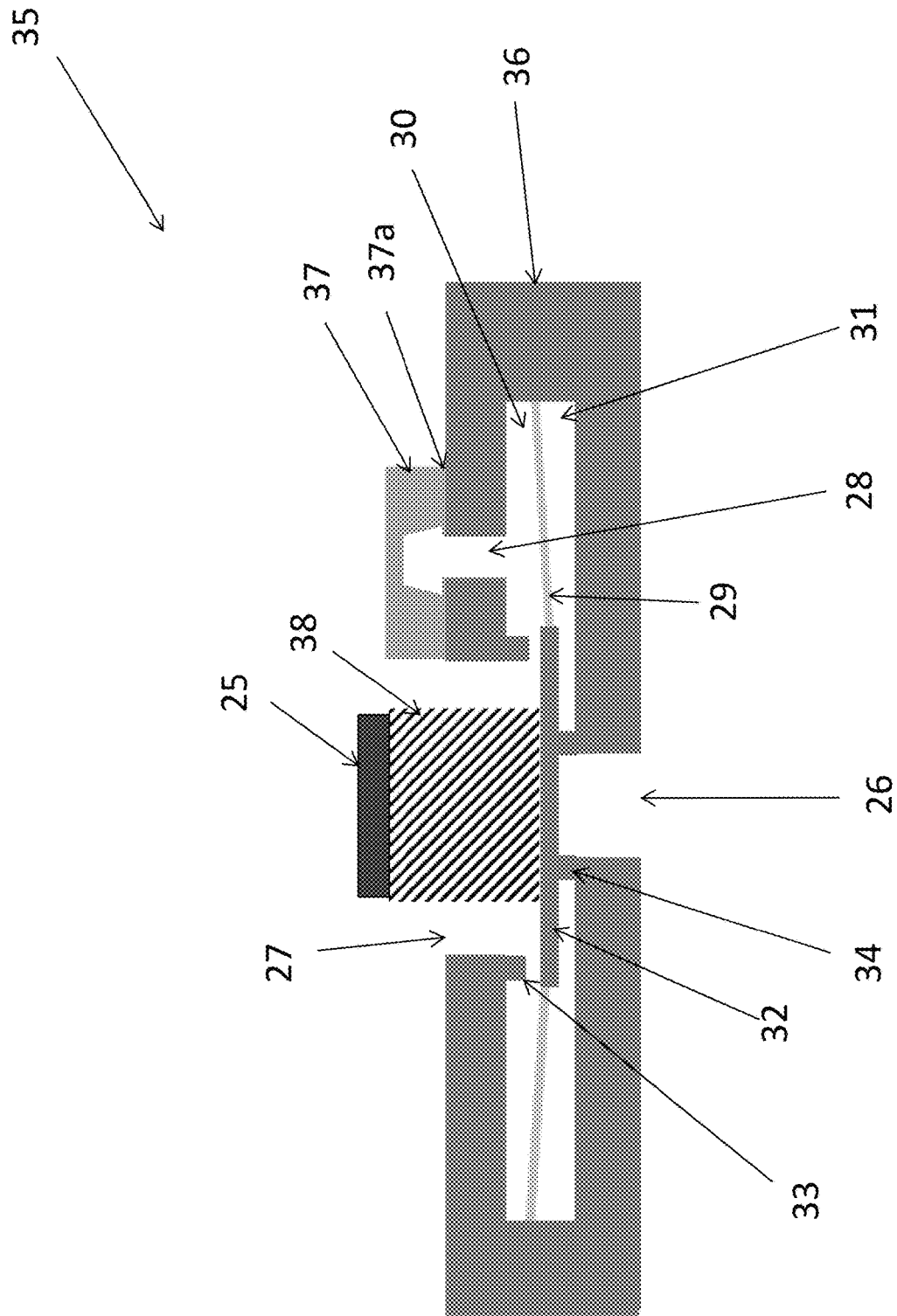

The second state of the present invention is shown in FIG. 2B. As before, this is a cross-sectional illustration of the invention and is not to dimensional scale. As shown in FIG. 2B, the microvalve 36 is open to fluid flowing from the first inlet port 27, through the gap between the sealing rings or surfaces 33 and the plunger plate 32, then through the upper valve chamber 30 and to the outlet port 28. This is due to the stacked piezoelectric actuator 38 elongating under an applied electrical signal (not shown) having the top of the piezoelectric actuator 38 in contact with a fixed support 25 and the bottom of the piezoelectric actuator 38 pressing the plunger plate 32 downward until it contacts the bottom sealing rings or surfaces 34 thereby closing off this fluid flow pathway originating from the second inlet port 26.

As shown in FIG. 2A and FIG. 1B, the pressure sensor 37 to measure the pressure at the microvalve 36 outlet port 28 is bonded to the opening of the outlet port 28 thereby creating a leak-proof seal 37a. Therefore, by bonding the pressure sensor 37 directly to the outlet port 28 of the microvalve 36 has enabled the elimination of tubing or conduits between the microvalve 36 and pressure sensor 37. This results in a substantial reduction of the fluidic capacitance since the volume between the microvalve 36 and pressure sensor have been reduced to a minimum.

Figure 3A:
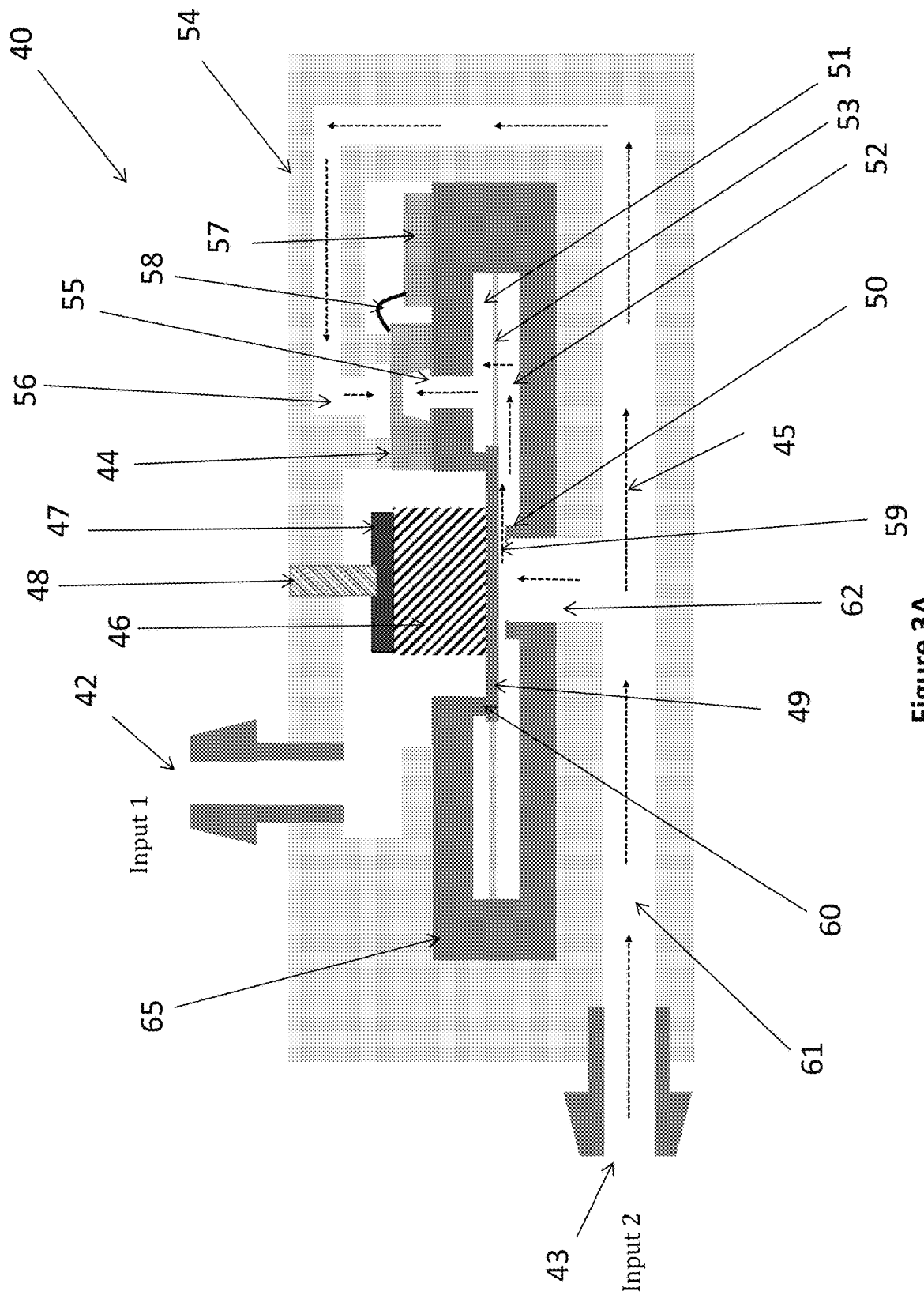
FIGS. 3A and 3B are cross sectional illustrations of an integrated microfluidic system shown encapsulated in a protective package of the present invention.
Figure 3B:
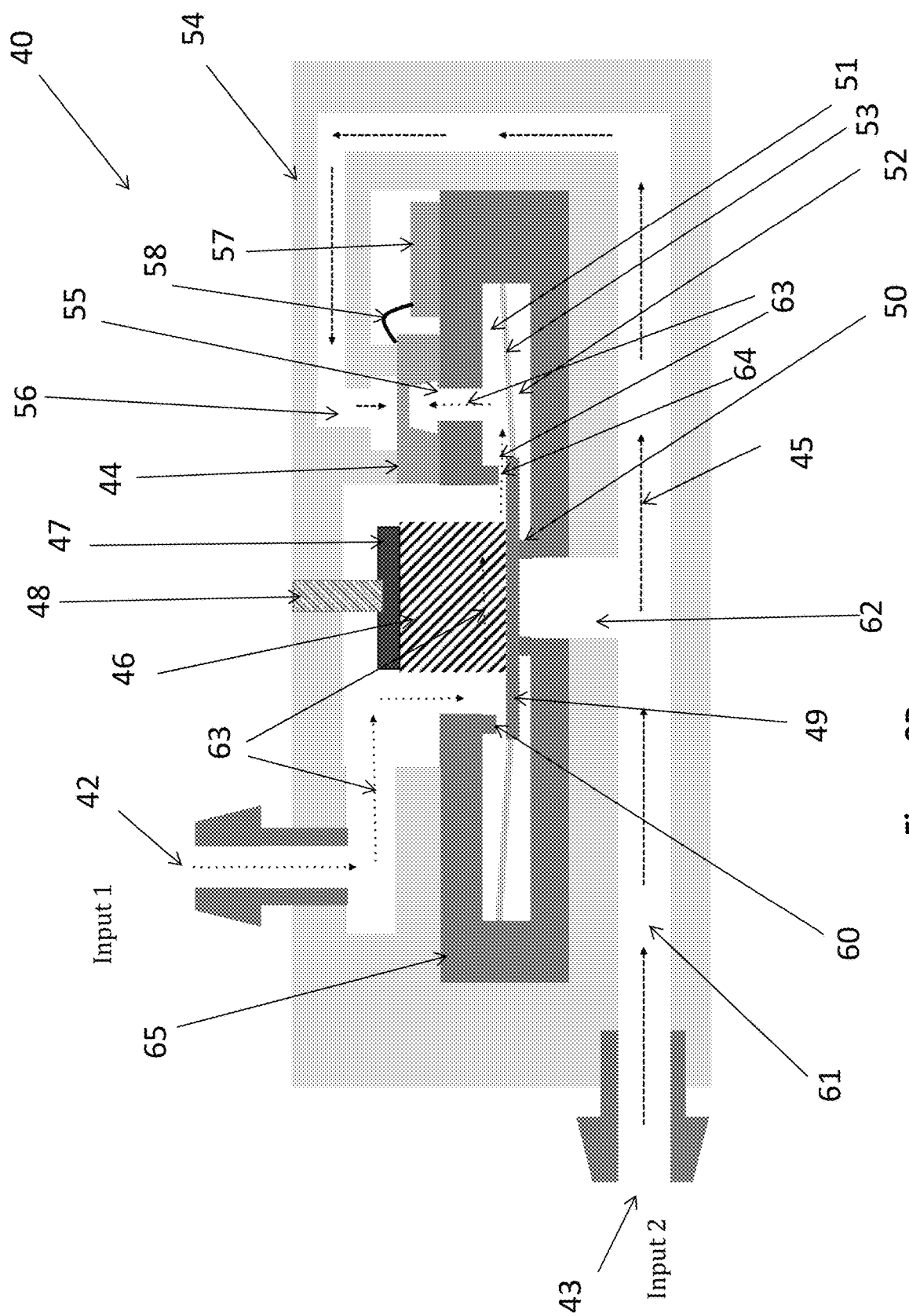

Another embodiment 40 of the integrated fluidic system of the present invention is shown in FIG. 3A and FIG. 3B. In this embodiment 40, the microvalve 65 and pressure sensor 44 are encapsulated into a package 54 with a first input port 42 and second inlet port 43. As before, this is illustration is shown in cross section and is not to dimensional scale. The microvalve 65 and pressure sensor 44 in FIG. 3 have the same structure and functionality as shown in FIGS. 2A and 2B, except they are encapsulated into a package 54.

FIG. 3A shows the microvalve 65 in an un-actuated state condition wherein the stacked piezoelectric actuator 46 has no electrical signal applied and therefore is not elongated. The piezoelectric actuator 46 is positioned between the plunger plate 49 of the microvalve 65 on the bottom and a fixed support 47 at the top. An adjustment mechanism 48 is provided in order to ensure that any gaps due to tolerances in the actuator mechanism composed of the plunger plate 49, the piezoelectric actuator 46, the fixed support 47 and the adjustment mechanism 48 are removed. In this un-actuated state, the plunger plate 49 of the microvalve 65 is in physical contact with the upper sealing rings or surfaces 60, with the result that fluid entering the first input port 42 is not allowed to flow through the microvalve 65 and reach the outlet port 55 of the microvalve 65.

In FIG. 3A, the second input port 43 allows the fluid 45 to pass through a flow channel 61 in the package 54. Part of the fluid flow enters the second inlet port 62 of the microvalve 65, and this fluid 59 passes over the bottom sealing rings or surfaces 50 of the microvalve 65, then into the lower chamber 52 of the microvalve 65, through openings (not shown explicitly) made in the membrane 53 of the microvalve 65, into the upper chamber 51 of the microvalve 65, and then exits the outlet port 55 of the microvalve 65 thereby applying the fluid pressure against the bottom side of the pressure sensor 44. The fluid 45 flow also continues along the flow channel 61 in the package 54 to reach the cavity 56 above the pressure sensor 44 wherein the fluid 45 applies pressure to the top side of the pressure sensor 44. Since the fluid 45 pressures on either side of the pressure sensor 44 at the same, the pressure sensor 44 reads a zero pressure differential.

One difference in FIGS. 3A and 3B and FIGS. 2A and 2B is that FIGS. 3A and 2B show a separate microelectronics die 57 that is bonded to the top surface of the microvalve 65 die over the outlet port 55 of the microvalve 65. The microelectronics die 57 performs electrical functions for the pressure sensor 44 including, biasing the sensing elements, reading out the sensor 44 output signal, processing the sensor 44 output signal, and compensation functionality of the sensor 44. In FIG. 3A, the electrical signals between the pressure sensor 44 and the microelectronics die 57 are conducted by wire-bond 58 interconnections. Other electrical connection schemes may be used as well.

The second state condition of the fluidic system (embodiment 40) is shown in FIG. 3B; again in cross section and not to dimensional scale. In this state, the stacked piezoelectric actuator 46 has an electrical signal applied to cause it to actuate and thereby elongate. Since the piezoelectric actuator 46 is positioned against a fixed support 47 and any gaps due to tolerances have been removed using the adjustment mechanism 48, the piezoelectric actuator 46 when actuated applies a downward force on the plunger plate 49 causing it to displace downward sufficiently to come into physical contact with the bottom sealing rings or surfaces 50. This closes off the fluid flow entering the second inlet port 62 of the microvalve 65. Therefore, fluid 45 entering the second input port 43 of the package 54 flows along the flow channel 61 in the package 54 and reaches the top cavity 56 above the top surface of the pressure sensor 44 thereby applying the fluid pressure onto the top surface of the pressure sensor 44. Fluid 63 also enters the first input port 42 of the package 54 and flows through the structure, and through the gap created 64 between the plunger plate 49 and the top sealing rings or surfaces 60, and then passes through the upper chamber 51 of the microvalve 65, and exits through the outlet port 55 of the microvalve 65, thereby applying the fluid 63 pressure from the first input port 42 to the bottom surface of the pressure sensor 44. Consequently, in this second state condition, the pressure sensor 44 measures the difference in fluid pressures from the first fluid input port 42 and the second fluid input port 43.

The method of bonding of the pressure sensor to the microvalve to form an integrated fluidic system of the present invention is now disclosed.

Substrate bonding is fabrication technique wherein two or more substrates are placed into physical contact and bonded together to thereafter act as one "composite" substrate that has sufficient bond strength so that the bonded substrates remain bonded for subsequent processing steps as well as use in the intended application. Substrate bonding can be performed on many material types including: semiconductors, ceramics, metals, plastics, and others. Substrate bonding is particularly useful in the implementation of microfluidic devices, such as microvalves and micropumps as well as micro- and nano-fluidic systems.

There are two major methods that are used for substrate bonding. One is to bond substrates without the use of an intermediary layer between the bonded substrates and the second is to bond substrates with the use of an intermediary layer between the bonded substrates. Both are claimed in the preset disclosure as methods to implement integrated microfluidic systems.

Substrate bonding use methods to prepare the substrates prior to bonding. Specifically, the two substrates are cleaned and prepared, and then physically contacted. Some level of force (or pressure per unit area) is usually applied to the substrates after they are physically contacted and the physically contacted substrate pair is usually exposed to an elevated temperature to obtain reasonable bond strength.

The preparation of the substrates prior to bonding is important to obtain good bonding strength as well as bonding over the entire substrate surfaces, that is, bonding of the substrates without the presence of unintentional voids between the two bonded substrates.

First, the substrates to be bonded should be clean, smooth and flat over the surfaces. Cleaning of the substrates is important to remove any particulates, residual chemicals, or other contaminates between the surfaces to be bonded. Cleaning can be done with a number of suitable methods.

Smoothness of the substrates to be bonded is another important criteria since a smooth surface provides for more surface area for bonding between the bonded substrates.

Flatness levels are also important since any non-flatness will result in the bonded substrates not being in contact across the entire surfaces.

Controlled ambient gases for substrate bonding can be used for a variety of purposes. The ambient used during bonding can control the contents of trapped gases between the substrates to achieve certain outcomes and the use of ambient gases during high temperature exposure can also result in improved bonding strength.

Exposure of the substrate surfaces to a plasma can be used to enhance the chemical activation of the surfaces prior to bonding thereby resulting in increased bonding strengths.

Bonding of substrates without an intermediary layer is commonly referred to as "direct" bonding or "fusion" bonding. This method is based on the fact that if surfaces to be bonded are sufficiently flat, smooth and clean, they will bond together. There is essentially a chemical process involved since the two bonded surfaces are chemically bonded to one another. This process can result in bond strengths that are very high, even larger than the fracture strength of the substrate materials. The key element in this method of bonding is to obtain substrate surfaces that are sufficiently flat, smooth and clean. Fortunately, modern methods of substrate processing easily enable these criteria to be obtained. Surfaces having root-mean square roughness (rms) roughness values of a few Angstroms are readily available.

Further, with modern polishing methods it is readily feasible to obtain substrate flatness values of less then one micron over a substrate several inches or more in diameter. Cleaning methods using electronic grade chemicals and deionized water are also readily available and are routinely used to clean substrate surfaces of virtually all particulates, and chemical residues and contaminants.

Figure 4A:
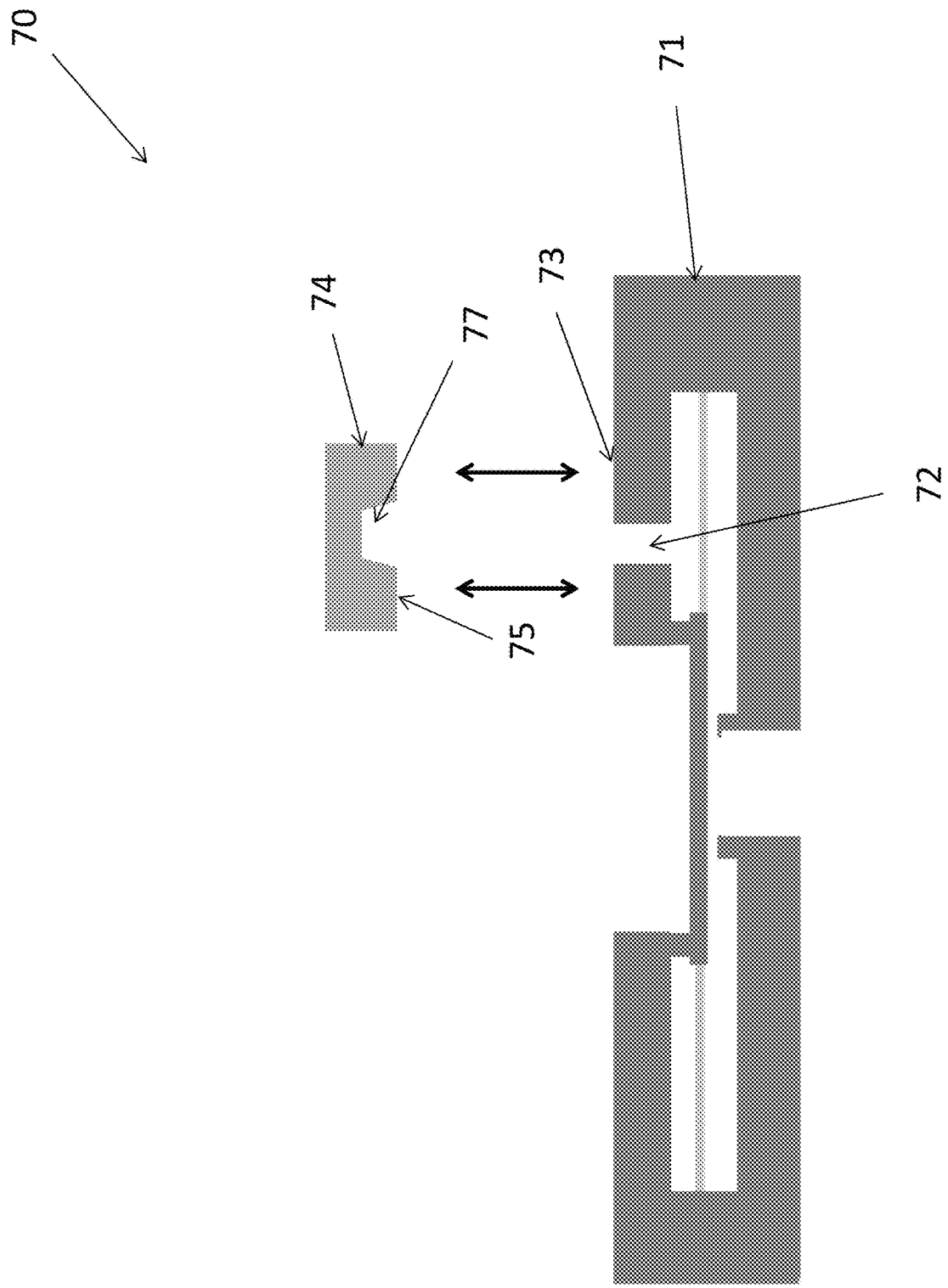
FIGS. 4A and 4B are cross sectional illustrations of one embodiment of the present invention of the method of bonding microfluidic devices to one another without the use of an intermediary layer.
Figure 4B:
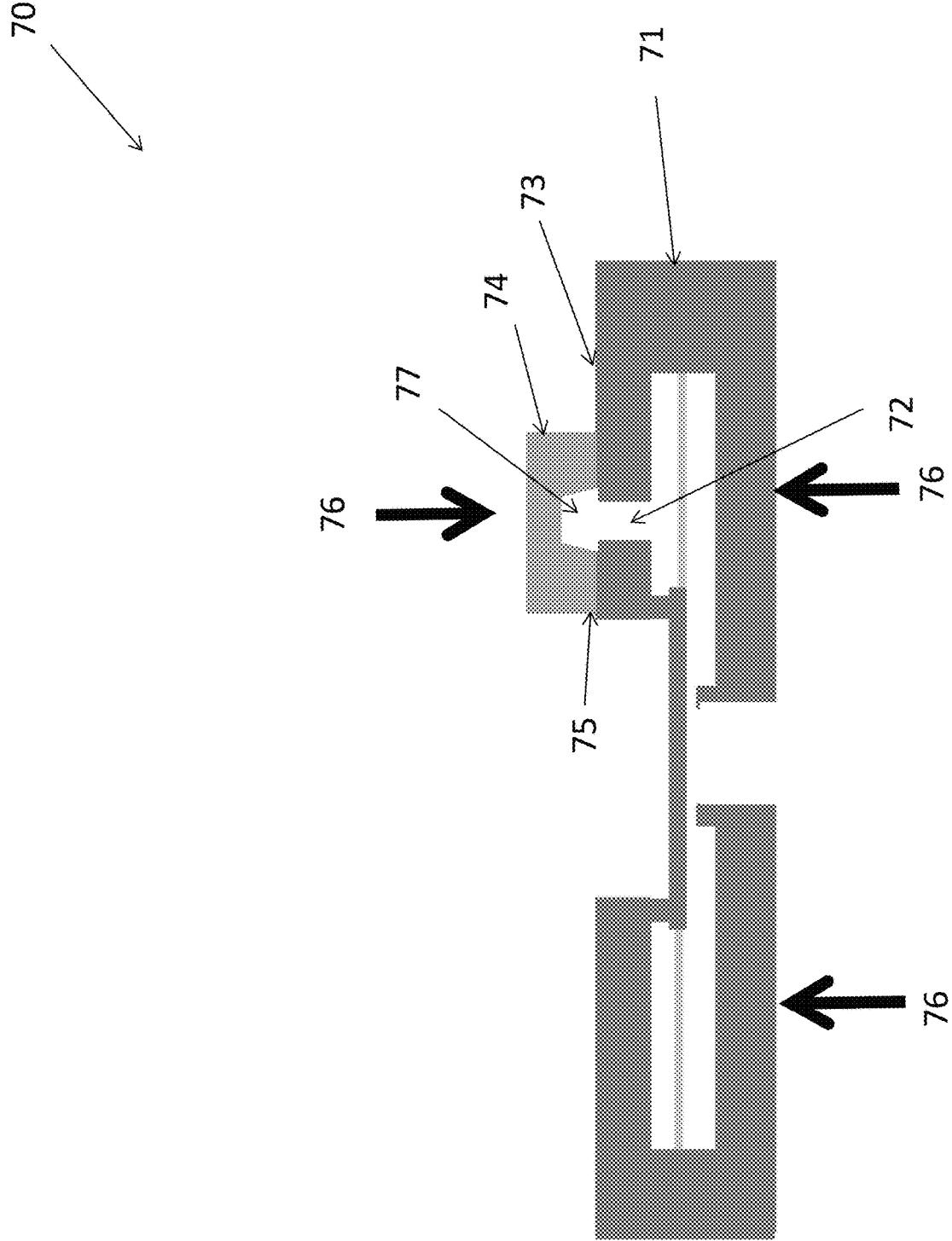

FIG. 4A shows one embodiment 70 of the present invention as a method for bonding substrates 71 and 74 together to implement microfluidic systems. In this embodiment 70, the substrates 71 and 74 are to be bonded directly without the use of an intermediary layer. Prior to physical contact, the substrates 71 and 75 are prepared. The preparation may entail polishing and cleaning in order to achieve surfaces 73 and 75 sufficiently smooth, flat and clean for the bonding to take place. Specifically, the substrate surfaces 73 and 75 should be polished such that the surface smoothness of at least 4 Angstroms or smaller and the flatness of at least 1 micron over a one-square inch area or smaller. This can be achieved using chemical-mechanical polishing techniques. Cleaning can be done with a number of suitable chemical immersions such as: hydrogen peroxide followed by a rinse in deionized (DI) water; sulfuric acid followed by a rinse in water, RCA cleaning; rinse in DI water; and others, any of which can be performed with or without ultrasonic agitation.

Additionally and optionally, the surfaces 73 and 75 may be exposed to a plasma environment prior to bonding in order to activate the surfaces 73 and 75 to enhance the bonding. Activation in this context means providing sufficient electrical charge on the surfaces 73 and 75 so that the substrate surfaces 73 and 75 have a mutual attraction. Plasma activation can be performed in any plasma process tool using a combination of Oxygen and Nitrogen process gases, as well as other gases that result in a residual electrical charge on the substrate surfaces 73 and 75.

If the substrates 71 and 74 are made from a semiconductor-grade substrates, such as single-crystal silicon, the surfaces 73 and 75 are likely to be sufficiently smooth and flat for substrate bonding so that no further polishing is required.

As shown in FIG. 4A, the microvalve substrate 71 surface 73 is prepared using the above described methods and likewise the pressure sensor 74 surface 75 is also prepared.

Bonding may involve alignment of features on the two substrates 71 and 74 to one another as in the present description. Specifically in FIG. 4A, the two substrates 71 and 74 are aligned so that the cavity 77 to form the sensing membrane of the pressure sensor 74 to that of the outlet port 72 of the microvalve substrate 71. The surface 75 of the pressure sensor substrate 74 is brought into physical contact with the surface 73 of the microvalve substrate 71. Alternatively, the substrates 71 and 74 may be aligned to other features on the substrates 71 and 74 or aligned according to the flats (not shown) or the substrate 71 and 74 edges.

After the alignment has been performed, the substrates 71 and 74 are then physically contacted by the substrate bonder tool (not shown) such as a Suss MicroTech Substrate Bonder tool. The substrate bonder carefully brings the substrates 71 and 74 into physical contact by bringing the surfaces 73 and 75 of the two substrates 71 and 74 together so that the two substrate planes are nearly exactly parallel to one another. That is, the substrates 71 and 74 are brought together without tilting them (i.e., without any pitch or yaw) so that the entire substrates 71 and 74 surfaces 73 and 75 simultaneously come into contact without them to slide against one another. Upon physical contact, a force per unit area and an elevated temperature 76 are applied to the substrates 71 and 74.

Note that the area of contact of the two substrates 71 and 74 may be less than entire surfaces areas of the substrates 71 and 74 depending on the topology of the substrate 71 and 74 surfaces 73 and 75. The applied force and elevated temperature 76 facilitate the substrate 71 and 74 bonding process.

The magnitude of the force level and temperature 76 will depend on the conditions of the substrate 71 and 74 surfaces 73 and 75 prior to the physical contact, but at a minimum will be 0.1 Bar per square inch or more, and the temperature will be 250-degrees Celsius or more. The time that the force and temperature is applied depends on the bond strength desired as well as the preparation of the substrates 71 and 74 surfaces 73 and 75 prior to the physical contacting, but in general will be a minimum of 5 to 10 minutes.

After the bonding has been completed, the applied force and temperature are removed and the substrates 71 and 74 will be bonded with sufficient strength to withstand handling and application stresses.

The other major method of substrate bonding uses an intermediary layer between the substrates that is deposited onto one or both of the substrate surfaces prior to bonding. Generally, the use of intermediary layers for substrate bonding somewhat relaxes the constraints on the flatness, smoothness and cleanliness of the substrate surfaces to get good bonding strength and therefore this method is commonly used in situations where the substrates have been extensively processed prior to bonding; or the substrates cannot undergo processing steps that would remove roughness or un-flatness (e.g., chemical-mechanical polishing (CMP)); or the substrates cannot undergo vigorous cleaning processes; or there are material issues that preclude direct bonding. Substrate bonding using intermediary layers is also a common method for packaging of devices and systems.

Figure 5A:
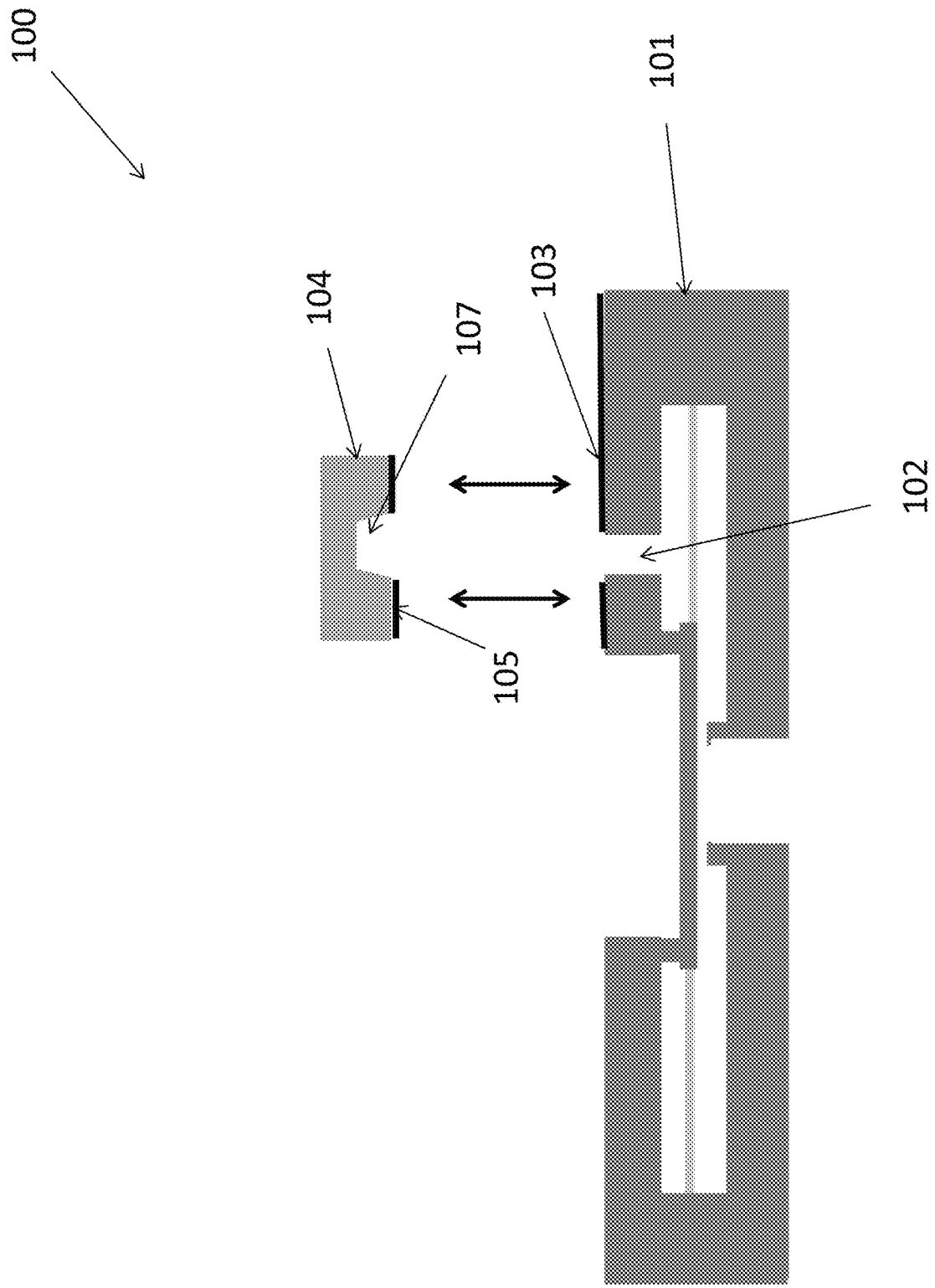
FIGS. 5A and 5B are cross sectional illustrations of one embodiment of the present invention of the method of bonding microfluidic devices to one another with the use of an intermediary layer.
Figure 5B:
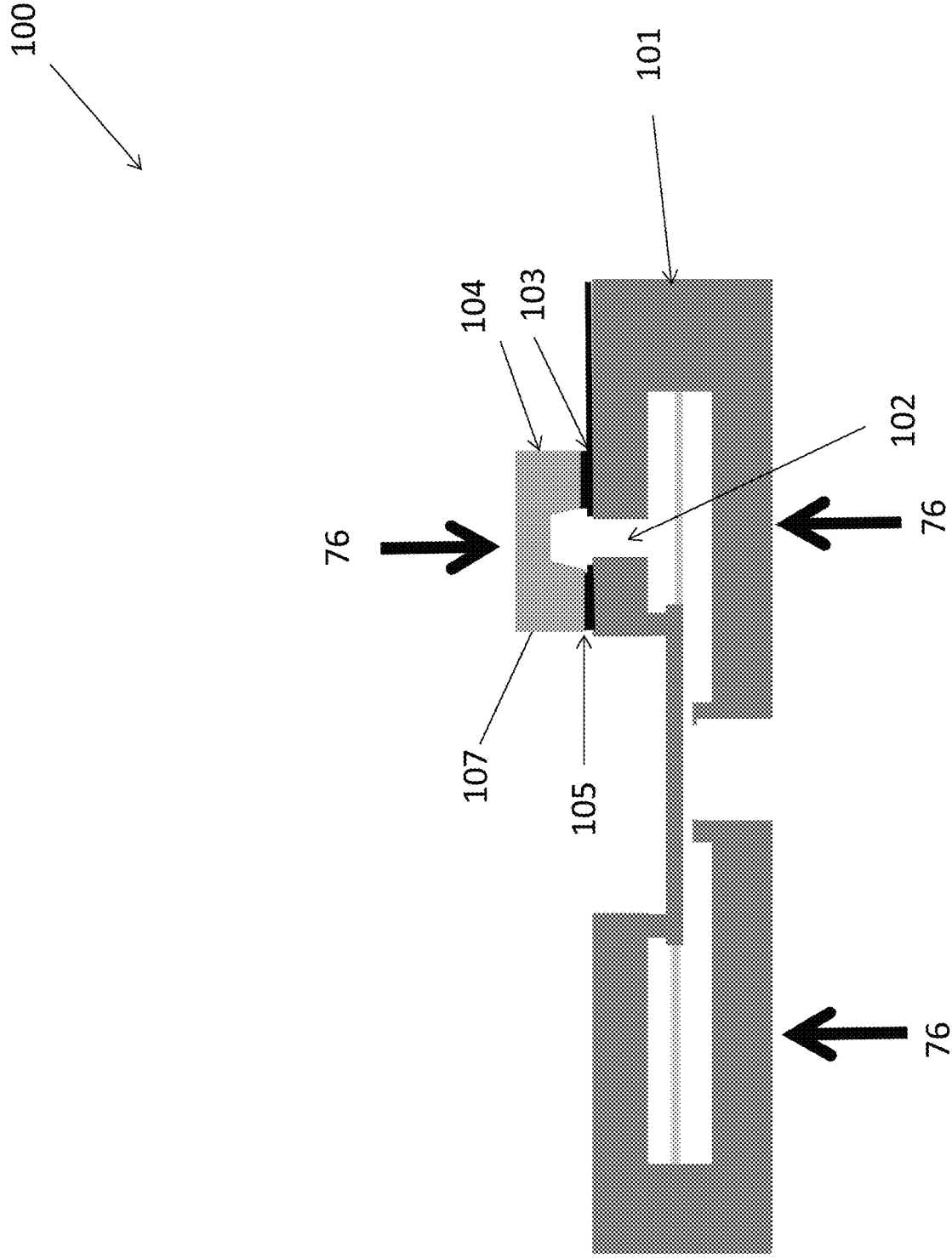

An example embodiment 100 of implementing microfluidic systems using substrate bonding with an intermediary layer is illustrated in FIG. 5a before bonding and in FIG. 5B after bonding. As before, the substrates 101 and 104 shown in FIGS. 5A and 5B are illustrated in cross sections and not to dimensional scale.

In FIG. 5 A the top substrate 104 has undergone pre-processing that has made one or more features or devices (e.g., micromachined cavity 107) into the top substrate 104. In this example 100, a pressure sensor has been implemented in the top substrate 104. Additionally, the bottom substrate 101 has also undergone pre-processing to implement a microvalve in the present example 100, and an intermediary layer 103 has been deposited and patterned on the top surface of the bottom substrate 101.

The substrates 101 and 104 are bonded as shown in FIG. 2B. Bonding using intermediary layers 103 and 105 is normally conducted on a specialized bonding apparatus such as a Suss MicroTech Wafer Bonder tool. Bonding may involve alignment of features on the two wafers 101 and 104 to one another as in the present description wherein the micromachined cavity 107 of the pressure sensor substrate 104 is aligned to the first outlet port 102 of the microvalve substrate 101. Alternatively, the substrates 101 and 104 may be aligned according to other features on the substrates, the substrate flats, or the edges of the substrates.

After the alignment has been performed, the substrates 101 and 104 are then physically contacted by the substrate bonder tool (not shown). The substrate bonder carefully brings the wafers 101 and 104 into physical contact by bringing the surfaces 103 and 105 of the two substrates 101 and 104 together so that the two substrate 101 and 104 planes are nearly exactly parallel to one another. That is, the substrates 101 and 104 are brought together without tilting them (i.e., without any pitch or yaw) so that the entire substrate 101 and 104 surfaces 103 and 105 simultaneously come into contact without them to slide against one another.

Upon physical contact, a force per united area is applied over the contact areas of the surfaces 103 and 105 of the physically contacted substrates 101 and 104. Note that the area of contact of the two substrates 101 and 104 may be less than entire surfaces 103 and 105 areas of the substrates 101 and 104. Additionally, an elevated temperature 76 is also applied to the substrates 101 and 104 during bonding. The applied force and elevated temperature 76 shown in FIG. 5B facilitates the substrate bonding.

As shown in FIGS. 5A and 5B, intermediary layers 103 and 105 are on both surfaces 103 and 105 of the substrates 101 and 104 to be bonded. However, it is possible to perform the substrate 101 and 104 bonding with the intermediary layer 103 or 105 only on one of the substrates 101 or 104.

It can be seen in FIG. 5B that the bonded substrate pair has no gap between the surfaces 103 and 105 of the top substrate 101 and bottom substrate 104 bonded substrates.

If the integrated microfluidic system fabricated using this method of substrate bonding is used on microfluidic devices, the bonded surfaces 103 and 105 are leak-proof.

In one embodiment, one or both of the intermediary layers 103 and 105 are made from a material type called Benzocyclobutene (BCB). BCB can be deposited using a spin coating process and patterned using a number of processes including: using a photo-definable BCB and performing photolithography on the BCB layer to directly pattern it; or depositing a masking layer onto the BCB layer, performing photolithography on the masking layer, followed by patterning of the masking layer, followed by patterning of the BCB layer.

In order to improve the bonding strength and quality using an intermediary layer 103 and 105 of BCB the pre-curing and bonding conditions must be carefully chosen. The BCB is pre-baked to achieve a partially-cross linked state prior to bonding. The control cross-link ratio is achieved by controlling the duration and temperature in a bake oven. To achieve maximum deformation/reflow and lower bond pressure during bonding, it is preferable to have a low cross-link ratio. On the other hand, processing of the BCB intermediary layer 103 and 105 demands a higher cross-link ratio so that the exposure to the processing chemicals does not degrade the BCB or patterns in the BCB intermediary layer 103 and 105.

One embodiment of a recipe for the BCB intermediary layer 103 and 105 is as follows: Prior to the deposition of the BCB, the substrate surface is cleaned. This cleaning may include the exposure of the substrate surface to an oxygen ($O_2$) plasma for a suitable time period, usually a few minutes or less.

For example, the substrate cleaning could be an exposure to an oxygen ($O_2$) plasma for 3 minutes, at an oxygen flow rate of 30 sccm, a pressure of 200 mTorr, and a radio frequency (RF) plasma power of 100 Watts.

A BCB primer may then deposited onto the substrate surfaces although deposition of the primer is optional.

The BCB is then deposited on the substrate surface using a spin coating process. The spin speed, time, and spin ramp rates can be suitably determined for the exact BCB formulation, however a spin speed of 3000 rpm for 20 seconds can result in a thickness of BCB of 3 microns as one example. Other spin speeds and formulations can be used to obtain lesser or greater thicknesses.

The patterning of the BCB may be performed next using any suitable patterning method. In one embodiment, AZ 9260 photoresist is deposited onto the BCB deposited layer and photolithography is performed on the photoresist layer including exposure and development of the photoresist to result in the photoresist being suitably patterned. A layer of 100 Angstroms of titanium, followed by 2500 Angstroms of aluminum is then deposited onto the substrate using physical vapor deposition techniques. A lift-off patterning is then performed on the aluminum layer so as to pattern the aluminum layer.

That is, the aluminum is removed in areas where the aluminum covers the patterned photoresist and the aluminum is left remaining on the surface of the BCB where the photoresist has been removed. Subsequently, an oxygen ($O_2$) plasma is performed to etch the exposed BCB; that is, to etch the BCB not masked by the aluminum layer. The aluminum masking layer is then removed using a suitable aluminum etchant that does not damage the patterned BCB. The result is that the BCB layer has then been patterned and is ready for use as an intermediary layer for substrate bonding as described in this invention.

Alternatively, the BCB can be directly patterned using a photo-definable BCB material formulation. A photo-definable BCB is one that contains chemical agents that make the material able to be used similar to photoresist. This enables the BCB layer to be patterned using only photolithography (i.e., exposure at a wavelength that the photo-definable material is sensitive to through a mask, followed by development using a suitable developer solution). The BCB is spun onto the substrate and photolithography is performed whereupon the BCB is exposed and developed resulting in a patterned BCB material layer.

The substrate bonding process using a BCB intermediary layer is also important. The two substrates to be bonded using an intermediary layer of BCB are aligned and then physically contacted. A force per unit area and elevated temperature are applied to the physically contacted substrates to facilitate the bonding, that is, to result in a bond that has increased strength. As noted above, this is termed thermo-compression substrate bonding.

In one embodiment of the present invention, the pressure applied is less than or equal to 0.30 bar per inch$^2$ bonded over the physically contacted substrate pair and the temperature is less than or equal to 230 degrees Celsius.

In another embodiment of the present invention, the pressure applied is less than or equal to 0.70 bar per inch$^2$ bonded over the physically contacted substrate pair and the temperature is less than or equal to 250 degrees Celsius.

While BCB is one material that can be used for the intermediary layer in the present invention, there are other materials that may be used as well and can be chosen based on the device and process requirements of the situation.

One material system is a gold and tin alloy that can be co-deposited using physical vapor deposition. Another is an alloy composed of gold and indium that can also be are co-deposited using physical vapor deposition. Indium may also be used and can be deposited using physical vapor deposition. Tin may also be used and can be deposited using physical vapor deposition. These materials and material systems can be patterned using photolithography and etching or lift-off depending on the circumstances, which are well known in the art. Another material that can be used as an intermediary layer is epoxy. Prior to bonding the epoxy can be deposited in selective areas on the substrate surfaces in order to create regions on the substrates surfaces where the intermediary layer is located and other regions on the substrate surfaces where the intermediary layer is not located. Other materials and material systems that can be deposited onto substrates in a controlled manner and appropriately patterned can be used as an intermediary layer for the substrate bonding.

Figure 6:
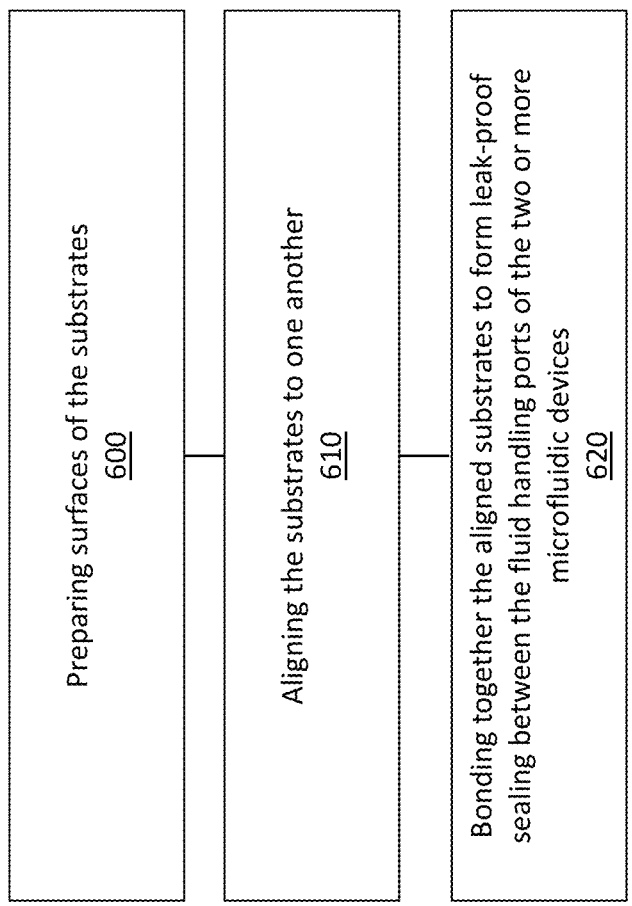
FIG. 6 illustrates steps of a method for fabrication an integrated microfluidic system, according to an example embodiment.

FIG. 6 illustrates steps of a method for fabrication an integrated microfluidic system, according to an example embodiment. The integrated microfluidic system may include two or more microfluidic devices each implemented on a different substrate. While operations in FIG. 6 are shown in a specific order, one or more of the operations may be omitted, substituted by another operations, and/or repeated.

As illustrated in FIG. 6, the method may include preparing surfaces of the substrates (step 610); aligning the substrates to one another (step 620); and bonding together the aligned substrates to form leak-proof sealing between the fluid handling ports of the two or more microfluidic devices (step 630).

FIG. 7 illustrates steps of a method for fabrication an integrated microfluidic system, according to another example embodiment. The integrated microfluidic system may include two or more microfluidic devices each implemented on a different substrate. While operations in FIG. 6 are shown in a specific order, one or more of the operations may be omitted, substituted by another operations, and/or repeated.

As illustrated in FIG. 7, the method may include: preparing surface of the substrates (step 700); disposing an intermediary layer onto at least one of the prepared surfaces of the substrates (step 710); patterning the deposited intermediary layer (step 720); aligning the substrates to one another (step 730); and bonding the substrate together to form leak-proof sealing between fluid handling port of the two or more microfluidic devices (step 740).

While example embodiments are described with reference to two microfluidic devices, in some examples of the present technology, a plurality of microfluidic devices may be bonded to a common surface of another microfluidic device, and/or one or more microfluidic devices may be provide between multiple microfluidic devices.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An integrated microfluidic system comprising:
   two or more separate functional and self-contained microfluidic devices microfabricated in one or more substrates;
   one or more first fluidic ports microfabricated on the substrate surfaces of each of the microfluidic devices providing fluidic access to an interior of the microfluidic devices,
      wherein the two or more first fluidic ports microfabricated on the different substrate surfaces are aligned,
      wherein the substrate surfaces of two or more separate microfluidic devices are bonded to each other such that the two or more first fluidic ports made on substrate surfaces of separate microfluidic devices are aligned to one another; and
   a protective enclosure of the two or more bonded microfluidic devices having one or more second fluidic a n-ports providing fluidic access to the microfluidic devices within the enclosure of the microfluidic system, wherein a fluidic capacitance, represented by an amount of fluidic dead volume between the two or more microfluidic devices in the microfluidic system is eliminated.

2. The integrated microfluidic system of claim 1, wherein a first microfluidic device of the two or more microfluidic devices is a microvalve device implemented in one of the one or more device substrates and another microfluidic device of the two or more microfluidic devices is a pressure sensor implemented on a second substrate of the one or more device substrates.

3. The integrated microfluidic system of claim 1, wherein one or more of the substrates comprise microelectronic devices and circuits for performing power, biasing, and signal conditioning operations for one or more of the microfluidic devices.

4. The integrated microfluidic system of claim 1, wherein a first device of the two or more microfluidic devices is a microvalve and a second device of the two or more microfluidic devices is a pressure sensor on a second substrate.

5. An integrated microfluidic system comprising:
   two or more separated functional and self-contained microfluidic devices microfabricated in one or more substrates;
   one or more first fluidic ports microfabricated on the substrate surfaces of each of the microfluidic devices providing fluidic access to an interior of the microfluidic devices,
   wherein the two or more first fluidic ports microfabricated on the different substrate surfaces are aligned,
   wherein the substrate surfaces of two or more separate microfluidic devices are bonded to each other such that the two or more first fluidic ports made on substrate surfaces of separate microfluidic devices are aligned to one another; and
   a protective enclosure of the two or more bonded microfluidic devices having one or more second fluidic ports providing fluidic access to the microfluidic devices within the enclosure of the microfluidic system,
   wherein a first device of the two or more microfluidic devices is a microvalve and a second device of the two or more microfluidic devices is a pressure sensor, and
   wherein the pressure sensor comprises a cavity and a perimeter of the cavity of the pressure sensor is bonded to a perimeter of an outlet port on the microvalve.

6. The integrated microfluidic system of claim 5, wherein a fluidic capacitance, represented by an amount of fluidic dead volume between the two or more microfluidic devices in the microfluidic system is eliminated.

7. The integrated microfluidic system of claim 5, wherein one or more of the substrates comprise microelectronic devices and circuits for performing power, biasing, and signal conditioning operations for one or more of the microfluidic devices.

* * * * *